（12) United States Patent
Arkun et al.

(10) Patent No.: US 9,496,132 B2
(45) Date of Patent: *Nov. 15, 2016

(54) NUCLEATION OF III-N ON REO TEMPLATES

(71) Applicant: TRANSLUCENT, INC., Palo Alto, CA (US)

(72) Inventors: Erdem Arkun, San Carlos, CA (US); Andrew Clark, Los Altos, CA (US); Rytis Dargis, Fremont, CA (US); Radek Roucka, Mountain View, CA (US); Michael Lebby, Apache Junction, AZ (US)

(73) Assignee: Translucent, Inc., Palo Alto, CA (US)

( * ) Notice: Subject to any disclaimer, the term of this patent is extended or adjusted under 35 U.S.C. 154(b) by 533 days.

This patent is subject to a terminal disclaimer.

(21) Appl. No.: 13/845,426

(22) Filed: Mar. 18, 2013

(65) Prior Publication Data

US 2013/0248853 A1 Sep. 26, 2013

Related U.S. Application Data

(60) Provisional application No. 61/613,289, filed on Mar. 20, 2012.

(51) Int. Cl.
*H01L 21/02* (2006.01)
*H01L 29/20* (2006.01)

(52) U.S. Cl.
CPC ..... *H01L 21/02192* (2013.01); *H01L 21/0254* (2013.01); *H01L 21/02247* (2013.01); *H01L 21/02252* (2013.01); *H01L 21/02381* (2013.01); *H01L 21/02458* (2013.01); *H01L 21/02488* (2013.01); *H01L 21/02502* (2013.01); *H01L 29/2003* (2013.01)

(58) Field of Classification Search
CPC .............. H01L 21/02458; H01L 21/0254; H01L 21/02488; H01L 21/02192; H01L 21/02247; H01L 21/02252; H01L 21/02502; H01L 29/2003; H01L 21/02389
USPC .................................................. 438/775–777
See application file for complete search history.

(56) References Cited

U.S. PATENT DOCUMENTS

| | | | |
|---|---|---|---|
| 8,268,076 B2 * | 9/2012 | Schroeder | H01L 21/02381 117/101 |
| 8,394,194 B1 * | 3/2013 | Dargis | C30B 1/02 117/4 |
| 8,501,635 B1 * | 8/2013 | Clark et al. | 438/779 |
| 8,633,569 B1 * | 1/2014 | Arkun | H01L 21/02381 257/11 |
| 8,748,900 B1 * | 6/2014 | Dargis | H01L 21/02381 257/76 |
| 8,823,055 B2 * | 9/2014 | Arkun | H01L 33/007 257/189 |
| 8,846,504 B1 * | 9/2014 | Dargis et al. | 438/481 |
| 8,878,188 B2 * | 11/2014 | Dargis | H01L 21/02192 257/190 |

(Continued)

*Primary Examiner* — Joseph C Nicely
(74) *Attorney, Agent, or Firm* — Robert A. Parsons; Michael W. Goltry; Parsons & Goltry

(57) ABSTRACT

A method of fabricating a layer of single crystal III-N material on a silicon substrate includes epitaxially growing a REO template on a silicon substrate. The template includes a REO layer adjacent the substrate with a crystal lattice spacing substantially matching the crystal lattice spacing of the substrate and selected to protect the substrate from nitridation. Either a rare earth oxynitride or a rare earth nitride is formed adjacent the upper surface of the template and a layer of single crystal III-N material is epitaxially grown thereon.

17 Claims, 4 Drawing Sheets

(56) References Cited

U.S. PATENT DOCUMENTS

| | | | | |
|---|---|---|---|---|
| 2007/0111458 A1* | 5/2007 | Sato et al. | | 438/308 |
| 2009/0001329 A1* | 1/2009 | Atanackovic | | H01L 21/3141 252/521.1 |
| 2010/0109047 A1* | 5/2010 | Clark | | H01L 21/02381 257/190 |
| 2011/0062446 A1* | 3/2011 | Goyal | | H01L 21/02381 257/64 |
| 2011/0203666 A1* | 8/2011 | Lebby | | H01L 31/0687 136/261 |
| 2012/0019902 A1* | 1/2012 | Williams | | H01S 3/0632 359/341.3 |
| 2012/0104567 A1* | 5/2012 | Clark | | H01L 21/7624 257/635 |
| 2012/0183767 A1* | 7/2012 | Dargis et al. | | 428/336 |
| 2013/0032858 A1* | 2/2013 | Clark et al. | | 257/190 |
| 2013/0099357 A1* | 4/2013 | Dargis et al. | | 257/615 |
| 2013/0153918 A1* | 6/2013 | Clark et al. | | 257/76 |
| 2013/0214282 A1* | 8/2013 | Arkun et al. | | 257/76 |
| 2013/0248853 A1* | 9/2013 | Arkun et al. | | 257/43 |
| 2013/0334568 A1* | 12/2013 | Machuca et al. | | 257/190 |
| 2014/0008644 A1* | 1/2014 | Dargis et al. | | 257/43 |
| 2014/0167057 A1* | 6/2014 | Arkun et al. | | 257/76 |
| 2014/0231818 A1* | 8/2014 | Arkun et al. | | 257/76 |
| 2014/0239307 A1* | 8/2014 | Dargis et al. | | 257/76 |
| 2014/0357014 A1* | 12/2014 | Lebby et al. | | 438/98 |
| 2015/0014676 A1* | 1/2015 | Dargis et al. | | 257/43 |
| 2015/0203990 A1* | 7/2015 | Dargis | | H01L 21/02293 257/76 |

* cited by examiner

Embodiment 1

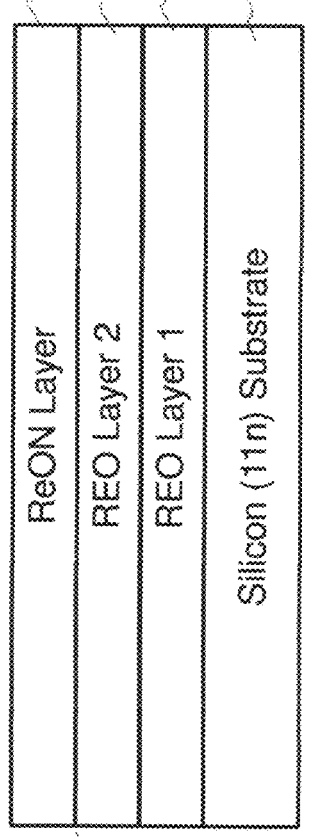

FIG. 1

- REO layer can be a combination of several Re metals, or split layers (i.e. REO1 + REO2)
- REO layer is converted into a ReN layer by exposing to a nitrogen plasma, or ammonia, implantation, growing a ReON, ReN compound, or any other method available to the qualified in the art.
- ReON has a smaller lattice constant than REO and mitigates the strain between REO and GaN which would be subsequently grown on top.

NUCLEATION OF III-N ON REO TEMPLATES

CROSS-REFERENCE TO RELATED APPLICATION

This application claims the benefit of U.S. Provisional Patent Application No. 61/613,289, filed 20 Mar. 2012.

FIELD OF THE INVENTION

This invention relates to the epitaxial growth of III-N materials on a silicon substrate using a rare earth template.

BACKGROUND OF THE INVENTION

Layers of single crystal gallium nitride, aluminum nitride, and other III-N materials formed on silicon substrates are applicable for electronic and photonic devices. In the prior art, silicon wafers are protected from nitridation to avoid adverse effects of silicon nitride, which is an amorphous material, on the growth of AlN and GaN layers in subsequent growth processes. However, some growth techniques, such as MOCVD, MBE, or ammonia based MBE, are not able to alleviate the problem effectively. Further, because of the relatively large lattice constant mismatch (−16.9%) between silicon and gallium nitride the straightforward or direct growth of gallium nitride on silicon leads to or results in the formation of a rough gallium nitride layer with high density dislocations. The rough layer with high density dislocations creates reliability problems for the fabrication of electronic and photonic devices. To date many different attempts to grow gallium nitride on silicon have been tried but these attempts generally are either very complicated or not very efficient.

It would be highly advantageous, therefore, to remedy the foregoing and other deficiencies inherent in the prior art.

Accordingly, it is an object of the present invention to provide new and improved methods for growing a III-N layer on a silicon substrate.

It is another object of the present invention to provide for the nucleation of III-N on a silicon substrate having a REO template formed thereon.

It is another object of the present invention to provide a template for the nucleation of III-N on a silicon substrate that serves two main purposes: to prevent nitridation of the silicon substrate and to crystal lattice match the III-N material to the substrate so as to provide an epitaxial relationship.

SUMMARY OF THE INVENTION

Briefly, to achieve the desired objects of the instant invention in accordance with a preferred method thereof, a method of fabricating a layer of single crystal III-N material on a silicon substrate is disclosed. The method includes epitaxially growing a REO template on a silicon substrate. The template includes a REO layer adjacent the substrate with a crystal lattice spacing substantially matching the crystal lattice spacing of the substrate and selected to protect the substrate from nitridation. Either a rare earth oxynitride or a rare earth nitride is formed adjacent the upper surface of the template and a layer of single crystal III-N material is epitaxially grown thereon.

The desired objects of the instant invention are further achieved in accordance with a specific embodiment of a device including a single crystal III-N material on a silicon substrate. The device includes a single crystal silicon substrate with a crystal lattice spacing and a REO template grown on the silicon substrate. The template includes a first rare earth oxide layer adjacent the substrate, with a crystal lattice spacing substantially matching the crystal lattice spacing of the substrate, and at least a portion of a second rare earth oxide layer including one of a rare earth oxynitride or a rare earth nitride. A layer of single crystal III-N material is epitaxially grown on the portion of the second rare earth oxide layer. The template is designed to prevent nitridation of the silicon substrate and to crystal lattice match the III-N material to the substrate so as to provide an epitaxial relationship between the III-N material and the substrate.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 1 is a simplified layer diagram illustrating an example of a REO template grown on a silicon substrate in accordance with the present invention;

DETAILED DESCRIPTION OF THE FIGURES

Figure 2:
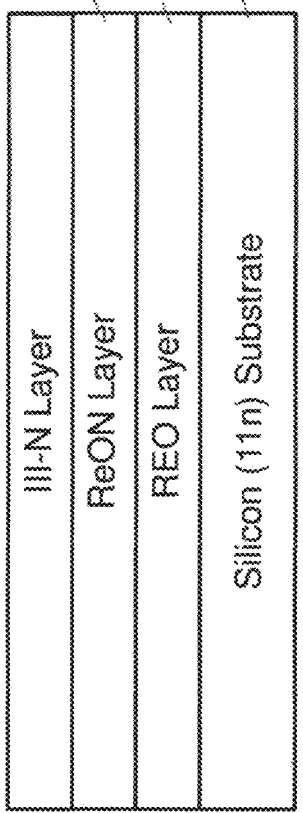
FIG. 2 is a simplified layer diagram illustrating an example of a III-N layer epitaxially grown on a REO template in accordance with the present invention.

Basically, the present invention includes the epitaxial growth of a rare earth oxide, nitride and/or oxynitride template on a silicon substrate. The specific rare earth material selected for the template remains a single crystal material upon conversion to nitride and has an epitaxial relationship to silicon. The main concept in this disclosure is the nucleation of a III-N material, such as GaN, on a rare earth template formed on a silicon substrate. Throughout this disclosure whenever rare earth materials are mentioned it will be understood that "rare earth" materials are generally defined as any of the lanthanides as well as scandium and yttrium. Also, whenever III-N materials are mentioned it will be understood that "III-N" materials are generally defined as nitrides of any of the III materials and combinations thereof from the periodic table of elements.

The template serves two main purposes: to prevent nitridation of the silicon substrate and to crystal lattice match the III-N material to the substrate so as to provide an epitaxial relationship. The surface of the template may be any one of a rare earth oxide, nitride or oxynitride and as nucleation occurs a rare earth oxide (REO) surface may be first converted (exposed to nitride) to a rare earth oxynitride (REON) or it may be substantially impervious to nitride and may remain REO. In any of the cases the silicon substrate is protected from nitridation and the III-N growth can be readily and relatively easily performed epitaxially.

In a specific example, when erbium oxide ($Er_2O_3$) is exposed to nitrogen plasma ($N_2$) a layer of ErN is grown on the surface that is in epitaxial relationship to the erbium oxide layer. When a layer of gallium nitride (GaN) is then grown on the erbium nitride the epitaxial relationship is retained. In contrast, when gadolinium oxide ($Gd_2O_3$) is exposed to nitrogen plasma ($N_2$) no or no measurable amount of GdN is grown on the surface. A layer of gallium nitride (GaN) can then be grown on the gadolinium oxide, but since the lattice structure of the gadolinium oxide is relatively close to silicon, the gallium nitride will be stressed in any epitaxial relationship. Thus, as an example, a layer of gadolinium oxide can be used on a silicon substrate to protect nitridation of the substrate and additional layers of rare earth oxide can be used to adjust the crystal lattice match to the gallium nitride or other III-N material.

Referring specifically to FIG. 1, a simplified layer diagram illustrates an example of a specific method of fabricating a structure 10. A single crystal silicon substrate 12 with a (11n) crystal orientation is provided. A first rare earth oxide (REO) structure 14 is epitaxially grown on the surface of substrate 12 by any of the various well known techniques. Structure 14 can be a single layer, a combination of several rare earth metals, or two or more sub-layers in which, for example, the crystal lattice constant is adjusted to more nearly match a desired III-N layer that will ultimately be epitaxially grown on the upper surface. The upper surface of structure 14 or an additional upper layer, herein designated 20, in this specific example can be converted to REON by exposing the REO upper surface of layer 20 to a nitrogen plasma. Here it should be specifically noted that REON layer 20 may be a rare earth oxide, a rare earth nitride, or a rare earth oxynitride, depending upon the specific application and materials selected. As stated above, a layer of III-N material can then be epitaxially grown on layer 20 with no nitridation or other degradation of substrate 12.

Referring to FIG. 2, a simplified layer diagram illustrates an example of a second specific method of fabricating a structure, designated 30. A single crystal silicon substrate 32 with a (11n) crystal orientation is provided. A rare earth oxide (REO) layer 34 is epitaxially grown on the surface of substrate 32 by any of the various well known techniques. In this specific example the REO is chosen so that a nitride layer 36 can be formed thereon. As an example, layer 34 can include erbium oxide ($Er_2O_3$). The upper surface of layer 34 or an additional sub-layer of erbium oxide is then converted to ErON or ErN by exposure to a nitrogen active species, such as nitrogen plasma, ammonia, etc., illustrated as REON layer 36. In this example, the ErON or ErN has a lattice parameter that is between gallium and silicon so that it bridges the lattice mismatch between GaN and silicon better than other oxide counterparts and a III-N layer 38 can be epitaxially grown on the surface.

Figure 3:
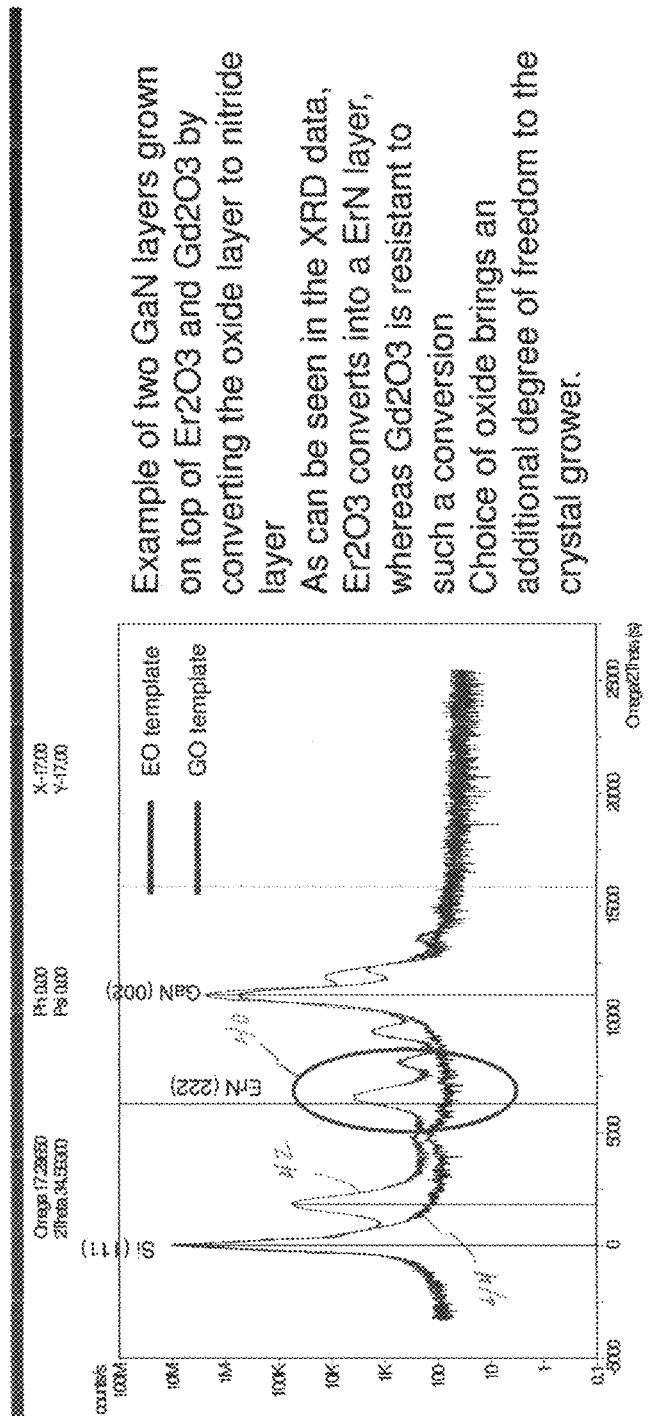
FIG. 3 is a xrd pattern illustrating the growth of GaN layers on erbium oxide and gadolinium oxide.

Turning additionally to FIG. 3, a pair of graphs illustrates the conversion of $Er_2O_3$ and $Gd_2O_3$ to a nitride. A first curve, designated 42, of the two graphs illustrates the $Er_2O_3$ and a second curve, designated 44, of the two graphs illustrates the $Gd_2O_3$. An area of the graph designated 40 illustrates the ready conversion of the $Er_2O_3$ to ErN while the $Gd_2O_3$ is practically unconverted and substantially remains $Gd_2O_3$.

Figure 4:
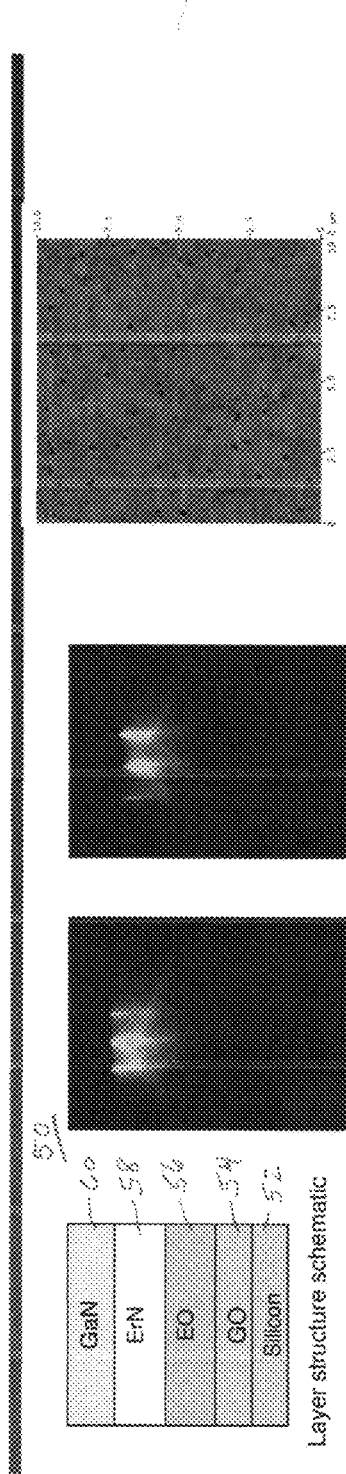
FIG. 4 is a simplified layer diagram illustrating an example of a specific III-N layer epitaxially grown on a REO template in accordance with the present invention.

Turning now to FIG. 4, a simplified layer diagram is illustrated showing an example of a specific structure 50 including a III-N layer epitaxially grown on a REO template in accordance with the present invention. Structure 50 includes a single crystal silicon substrate 52 with a (11n) crystal orientation. In this specific example a first layer 54 of gadolinium oxide is epitaxially grown on the surface of substrate 52. Since gadolinium oxide is relatively closely crystal lattice matched to silicon the epitaxial growth is relatively easy. Further, as explained above, the gadolinium oxide is substantially unaffected by nitride and will protect silicon substrate 52 from nitridation.

A layer 56 of erbium oxide is epitaxially grown on layer 54 and, while the lattice constants of the erbium oxide and gadolinium oxide are slightly different, layer 56 will be a single crystal layer which keeps the epitaxial relationship with layer 54. The upper surface of layer 56 or an additional sub-layer of erbium oxide is then converted to a layer 58 of ErON or ErN by exposure to a nitrogen active species, such as nitrogen plasma, ammonia, etc. A layer 60 of III-N material, in this specific example GaN, is then epitaxially grown on the surface of layer 58. It should be noted that the ErON or ErN has a lattice parameter that is between that of gadolinium oxide and gallium and bridges the lattice mismatch (along with the gadolinium oxide) between gallium nitride and silicon better than other oxide counterparts. Thus, III-N layer 60 can be epitaxially grown on layer 58 relatively easily.

Thus, new and improved methods for epitaxially growing a III-N layer on a silicon substrate while protecting the silicon substrate from nitridation is disclosed. Basically, the present invention provides for the nucleation of III-N material on a silicon substrate having a REO template formed thereon. The template serves two main purposes: to prevent nitridation of the silicon substrate and to crystal lattice match the III-N material to the substrate so as to provide an epitaxial relationship. While specific embodiments of the invention are described and illustrated, it will be understood that other embodiments may be devised from other materials while using the same generic structure.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same,

The invention claimed is:

1. A method of fabricating a layer of single crystal III-N material on a silicon substrate comprising:
   providing a single crystal silicon substrate with a crystal lattice spacing;
   epitaxially growing a rare earth oxide REO template on the silicon substrate, the template including a rare earth oxide layer adjacent the substrate with a crystal lattice spacing substantially matching the crystal lattice spacing of the substrate, and selecting the rare earth oxide layer to protect the substrate from nitridation;
   forming one of a rare earth oxynitride or a rare earth nitride adjacent the upper surface of the template; and
   epitaxially growing a layer of single crystal III-N material on the one of the rare earth oxynitride or the rare earth nitride.

2. A method as claimed in claim 1 wherein the rare earth oxide layer includes a rare earth oxide that is one of a material converted to a rare earth oxynitride by exposure to a nitrogen active species or a material that is substantially impervious to nitride and remains REO.

3. A method as claimed in claim 2 wherein the rare earth oxide layer is converted to a rare earth oxynitride and the material that is converted includes erbium oxide.

4. A method as claimed in claim 2 wherein the rare earth oxide layer is substantially impervious to nitride and remains REO and the material that is substantially impervious to nitride includes gadolinium oxide.

5. A method as claimed in claim 1 wherein the step of forming one of the rare earth oxynitride or the rare earth nitride adjacent the upper surface of the template includes exposing the surface of the rare earth oxide layer to a nitrogen plasma.

6. A method as claimed in claim 5 wherein the rare earth oxide includes erbium oxide and a layer of erbium oxynitride is formed in the rare earth oxide adjacent the surface.

7. A method as claimed in claim 5 wherein the rare earth oxide layer includes gadolinium oxide positioned adjacent the substrate and the step includes epitaxially growing a layer of erbium oxide on the layer of gadolinium oxide, the step further includes forming a layer including one of erbium oxynitride and erbium nitride from at least a portion of the layer of erbium oxide.

8. A method of fabricating a layer of single crystal III-N material on a silicon substrate comprising:
   providing a single crystal silicon substrate with a crystal lattice spacing;
   epitaxially growing a rare earth oxide REO template on the silicon substrate, the template including a first rare earth oxide layer adjacent the substrate with a crystal lattice spacing substantially matching the crystal lattice spacing of the substrate, and the first rare earth oxide layer being substantially impervious to nitridation;
   forming a second layer including one of a rare earth oxynitride or a rare earth nitride adjacent the upper surface of the template; and
   epitaxially growing a layer of single crystal III-N material on the second layer.

9. A method as claimed in claim 8 wherein the step of forming the second layer includes epitaxially growing a layer of rare earth oxide material on the first rare earth oxide layer and converting at least a portion of the rare earth oxide material to the one of the rare earth oxynitride or the rare earth nitride.

10. A method as claimed in claim 9 wherein the step of epitaxially growing the first rare earth oxide layer includes growing gadolinium oxide.

11. A method as claimed in claim 10 wherein the step of epitaxially growing the layer of rare earth oxide material on the first rare earth oxide layer includes growing erbium oxide and the step of converting includes converting the erbium oxide to one of erbium oxynitride or erbium nitride.

12. A single crystal III-N material on a silicon substrate comprising:
   a single crystal silicon substrate with a crystal lattice spacing;
   a rare earth oxide REO template grown on the silicon substrate, the template including a first rare earth oxide layer adjacent the substrate with a crystal lattice spacing substantially matching the crystal lattice spacing of the substrate, and at least a portion of a second rare earth oxide layer including one of a rare earth oxynitride or a rare earth nitride; and
   a layer of single crystal III-N material epitaxially grown on the at least a portion of the second rare earth oxide layer, the template designed to prevent nitridation of the silicon substrate and to crystal lattice match the III-N material to the substrate so as to provide an epitaxial relationship between the III-N material and the substrate.

13. A single crystal III-N material on a silicon substrate as claimed in claim 12 wherein the rare earth oxide layer adjacent the substrate includes a material substantially impervious to nitridation.

14. A single crystal III-N material on a silicon substrate as claimed in claim 13 wherein the rare earth oxide layer adjacent the substrate includes gadolinium oxide.

15. A single crystal III-N material on a silicon substrate comprising:
   a single crystal silicon substrate with a crystal lattice spacing;
   a rare earth oxide REO template grown on the silicon substrate, the template including a first rare earth oxide layer adjacent the substrate with a crystal lattice spacing substantially matching the crystal lattice spacing of the substrate and substantially impervious to nitridation;
   the template including a second rare earth oxide layer grown on the first rare earth oxide layer and at least a portion including one of a rare earth oxynitride or a rare earth nitride; and
   a layer of single crystal III-N material epitaxially grown on the at least a portion of the second rare earth oxide layer, the template designed to prevent nitridation of the silicon substrate and to crystal lattice match the III-N material to the substrate so as to provide an epitaxial relationship between the III-N material and the substrate.

16. A single crystal III-N material on a silicon substrate as claimed in claim 15 wherein the first rare earth oxide layer adjacent the substrate includes gadolinium oxide.

17. A single crystal III-N material on a silicon substrate as claimed in claim 15 wherein the second rare earth oxide layer includes erbium oxide and the rare earth oxynitride or the rare earth nitride include erbium oxynitride or erbium nitride, respectively.

* * * * *